(12) United States Patent
Zemlok

(10) Patent No.: US 6,806,454 B1
(45) Date of Patent: Oct. 19, 2004

(54) IMAGE SENSORS WITH VIA-COUPLED PHOTOCONDUCTIVE MEDIUMS

(75) Inventor: Kenneth Carl Zemlok, Westwood, MA (US)

(73) Assignee: Analog Devices, Inc., Norwood, MA (US)

( * ) Notice: Subject to any disclaimer, the term of this patent is extended or adjusted under 35 U.S.C. 154(b) by 315 days.

(21) Appl. No.: 10/160,716

(22) Filed: May 31, 2002

(51) Int. Cl.[7] ............................................. H01L 27/00
(52) U.S. Cl. ............................. 250/208.1; 250/214.1; 257/448
(58) Field of Search ..................... 250/208.1, 214.1; 257/448, 459, 465; 438/48

(56) References Cited

U.S. PATENT DOCUMENTS

| | | | |
|---|---|---|---|
| 5,796,433 A | | 8/1998 | Dyck |
| 5,886,353 A | | 3/1999 | Spivey et al. |
| 5,907,627 A | * | 5/1999 | Borza .......................... 382/124 |
| 6,100,570 A | | 8/2000 | Saito |
| 6,300,612 B1 | | 10/2001 | Yu |
| 6,320,189 B1 | | 11/2001 | Ouvrier-Buffet et al. |
| 6,501,142 B2 | * | 12/2002 | Thomas et al. .............. 257/414 |

* cited by examiner

*Primary Examiner*—Stephone B. Allen
*Assistant Examiner*—Patrick J. Lee
(74) *Attorney, Agent, or Firm*—Koppel, Jacobs, Patrick & Heybl

(57) ABSTRACT

Image sensors are provided that reduce conflicts between different sensor functions because sensor structures do not demand access to the same internal spaces. Accordingly, sensor structures can be independently arranged to enhance their respective functions. In particular, sensor embodiments include a substrate, semiconductor devices and an interconnect structure carried over the substrate, reference and sense electrodes and a photoconductive medium that are carried over the interconnect structure, and vias that couple the reference and sense electrodes to the interconnect structure and semiconductor devices. Different sensor elements do not demand access through the same internal VLSI spaces and may thus be arranged to enhance their respective sensor functions. In addition, sensors of the invention will respond to radiation rays that are orthogonal to the sensor's upper face and also to radiation rays that are tilted from this relationship.

45 Claims, 6 Drawing Sheets

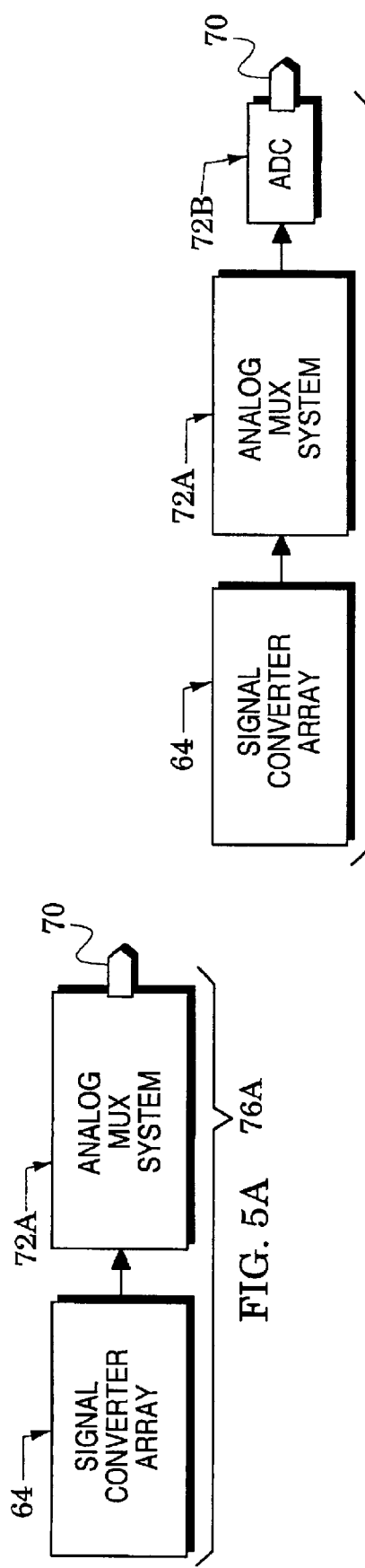
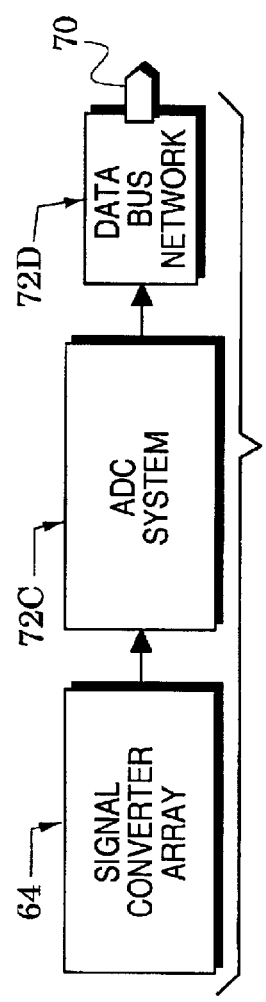
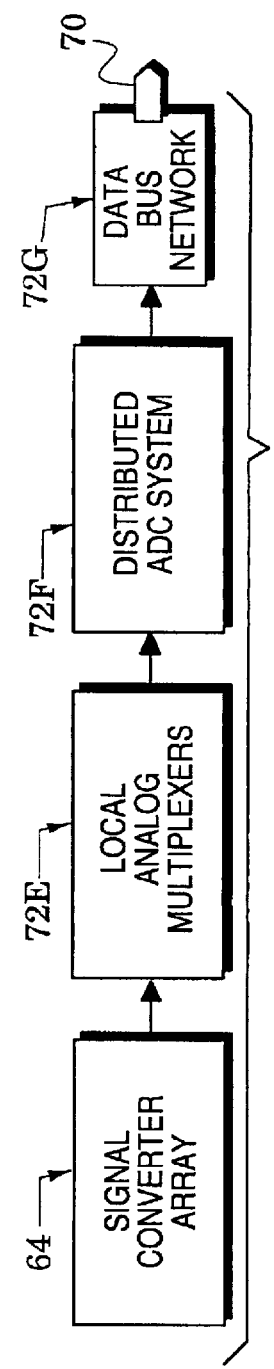
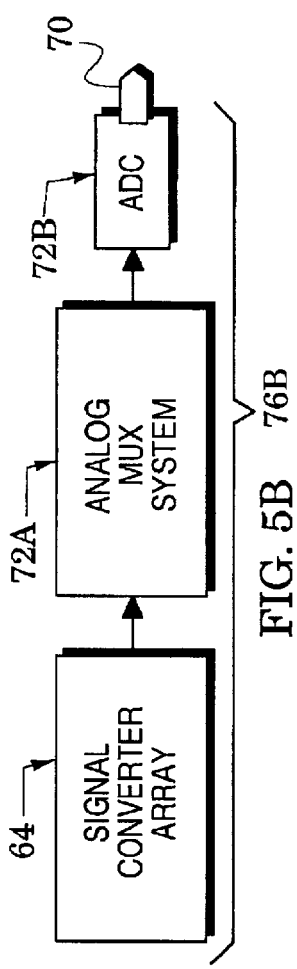
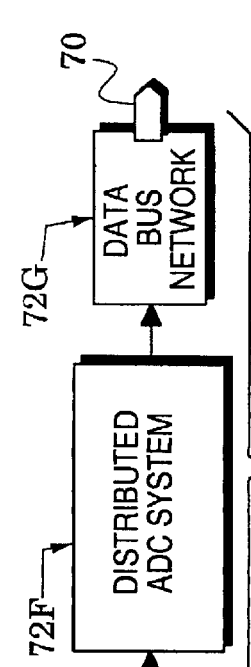
FIG. 5A
FIG. 5B
FIG. 5C
FIG. 5D

IMAGE SENSORS WITH VIA-COUPLED PHOTOCONDUCTIVE MEDIUMS

BACKGROUND OF THE INVENTION

1. Field of the Invention

The present invention relates generally to image sensors.

2. Description of the Related Art

A variety of modern electronic systems have created a strong demand for low-cost, high-quality, mega-pixel image sensors. In response to this demand, currently-available image sensors generally provide arrays of photodetectors (e.g., photogates or photodiodes) that are coupled to readout structures (e.g., charge-coupled-device (CCD) registers or complementary metal-oxide-semiconductor (CMOS) arrays). The photodetectors generate sense signals in response to incident electromagnetic radiation and the readout structures transport these sense signals to an image-sensor output port.

Currently-available image sensors are typically fabricated in accordance with very large-scale integration (VLSI) techniques. Accordingly, they take advantage of photolithographic processes which can define a large number of semiconductor devices on an underlying semiconductor substrate and also define a multiple-layer interconnect structure over the semiconductor devices to facilitate routing of signals and power among these devices.

Current image-sensor arrangements, however, create a significant conflict because different functional systems of the image sensor demand access through the same internal spaces of the VLSI structure. This conflict is exemplified in FIG. 1 which illustrates a conventional image sensor 20 that carries photolithographically-generated semiconductor devices 22 on a (typically silicon) substrate 24. Arranged over the semiconductor devices is a photolithographically-generated interconnect structure 26 that comprises alternating layers of interconnect lines and insulators.

The interconnect structure 26 connects a portion of the semiconductor devices 22 to form an array of photodetectors 28 which each receive focused electromagnetic radiation 30 from a respective one of an array of microlenses 32 that are positioned in the upper part of the image sensor. Although microlenses are not required in all image sensors, they are often used for increasing the percentage of electromagnetic radiation that falls upon the photodetector array.

The sensed signals generated by each of the photodetectors represents a respective pixel in a detected image and these sensed signals are routed to a sensor output port by a transmission system that is formed with the interconnect structure 26 and other portions of the semiconductor devices 22.

From FIG. 1, it is apparent that the focused incident radiation 30 must pass through the interconnect structure 26 to impinge upon the photodetectors 28. Due to various restraints (e.g., intrinsic properties of silicon and application-imposed boundary constraints), each pixel portion of radiation has asymptotically approached a current lateral dimension 34 on the order of 3 micrometers. In contrast, an exemplary 90 nanometer VLSI fabrication process can form something on the order of 100 semiconductor devices in the same area of the substrate 24.

Accordingly, a substantial number of semiconductor devices and a significant portion of the interconnect lines are excluded from the regions of incident radiation 30. This exclusion imposes a number of penalties (e.g., increased chip size, increased design and fabrication costs and decreased performance features) on the current image sensor art. Although concepts have been proposed (e.g., optically-transparent interconnect lines) to alleviate some of these penalties, they generally add other disadvantages (e.g., increased sensor cost).

SUMMARY OF THE INVENTION

The present invention is directed to image sensors that reduce conflicts between different sensor functions. Sensor embodiments of the invention include:

a) a substrate, b) semiconductor devices and an interconnect structure carried over the substrate, c) reference and sense electrodes and a photoconductive medium that are carried over the interconnect structure, and d) vias that couple the reference and sense electrodes to the interconnect structure and semiconductor devices.

The semiconductor devices are thereby connectable by the interconnect structure to realize the functions of a signal conversion and transmission circuit without regard to the sense functions of the photoconductive medium and its associated reference and sense electrodes. Different sensor elements do not demand access through the same internal VLSI spaces and may thus be independently arranged to enhance their respective sensor functions. Coupling is realized by vias whose lateral extent is negligible and which may be laterally moved so long as they contact their intended target.

In addition, sensors of the invention are suitable for a wide variety of sensor applications because they will respond to radiation rays that are orthogonal to the sensor's upper face and also to radiation rays that are tilted from this relationship, and radiation that would otherwise be attenuated or scattered by passage through associated structures.

The novel features of the invention are set forth with particularity in the appended claims. The invention will be best understood from the following description when read in conjunction with the accompanying drawings.

DETAILED DESCRIPTION OF THE INVENTION

Figure 1:
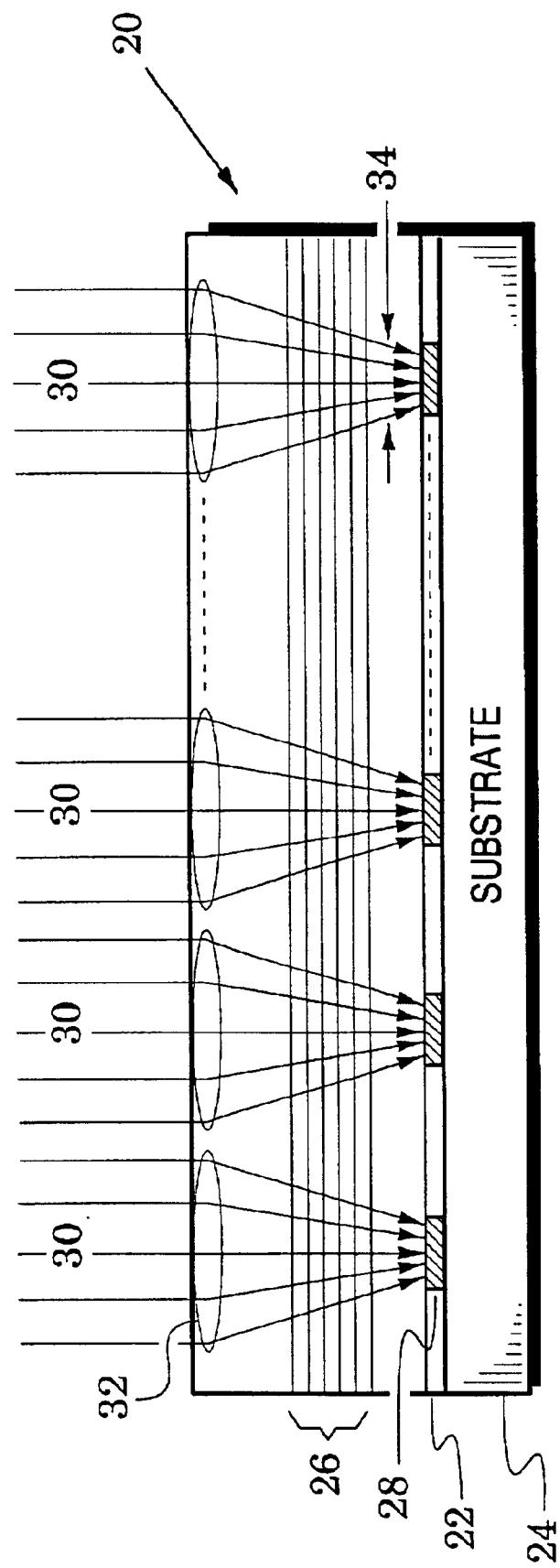
FIG. 1 is a sectional view through a conventional image sensor.
Figure 2:
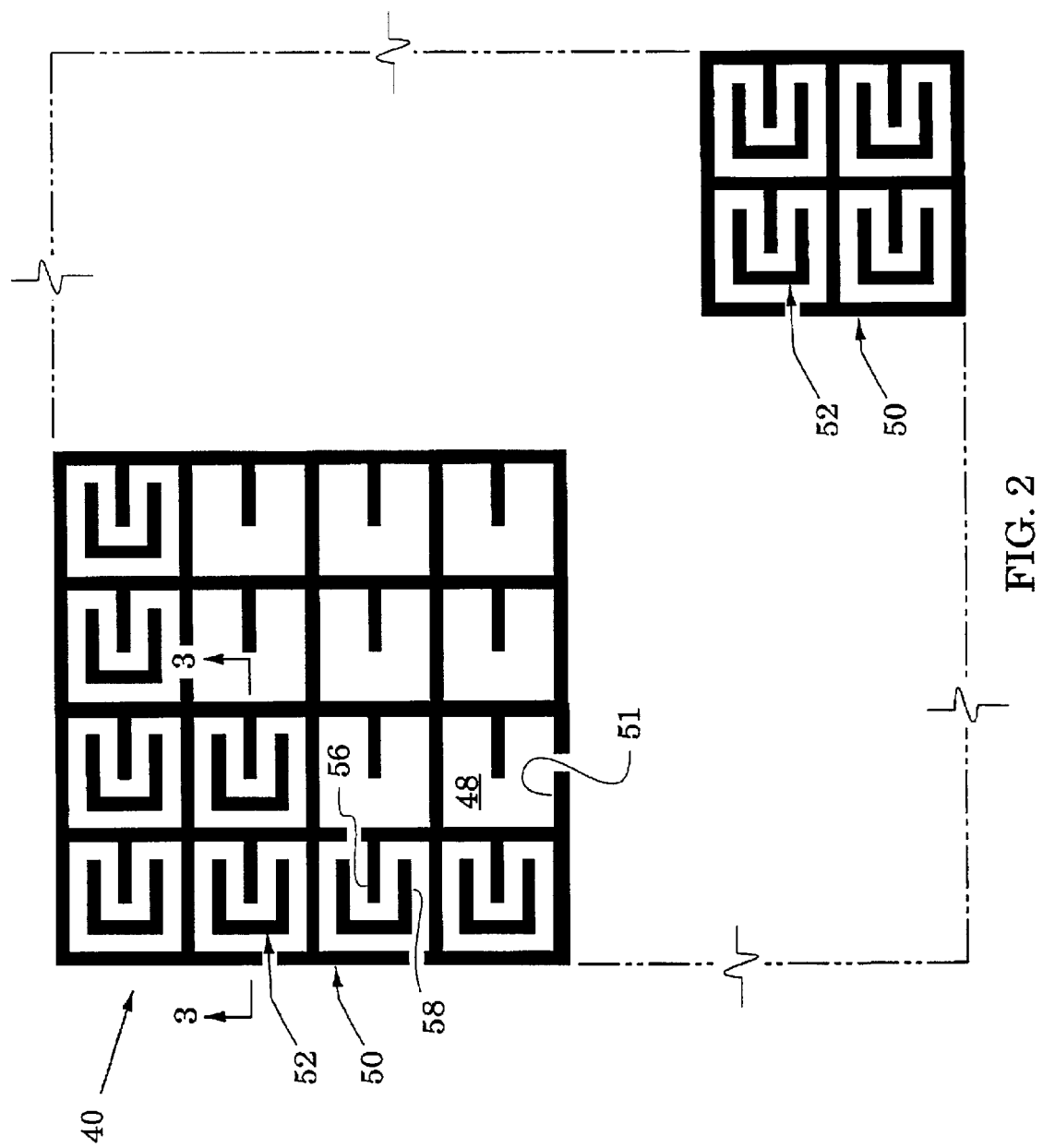
FIG. 2 is a top view of an image sensor embodiment of the present invention wherein only the upper left and lower right corners of the sensor are shown in detail and sense electrodes are eliminated in a portion of the upper left corner to more clearly indicate a reference electrode and a photoconductive medium.
Figure 3:
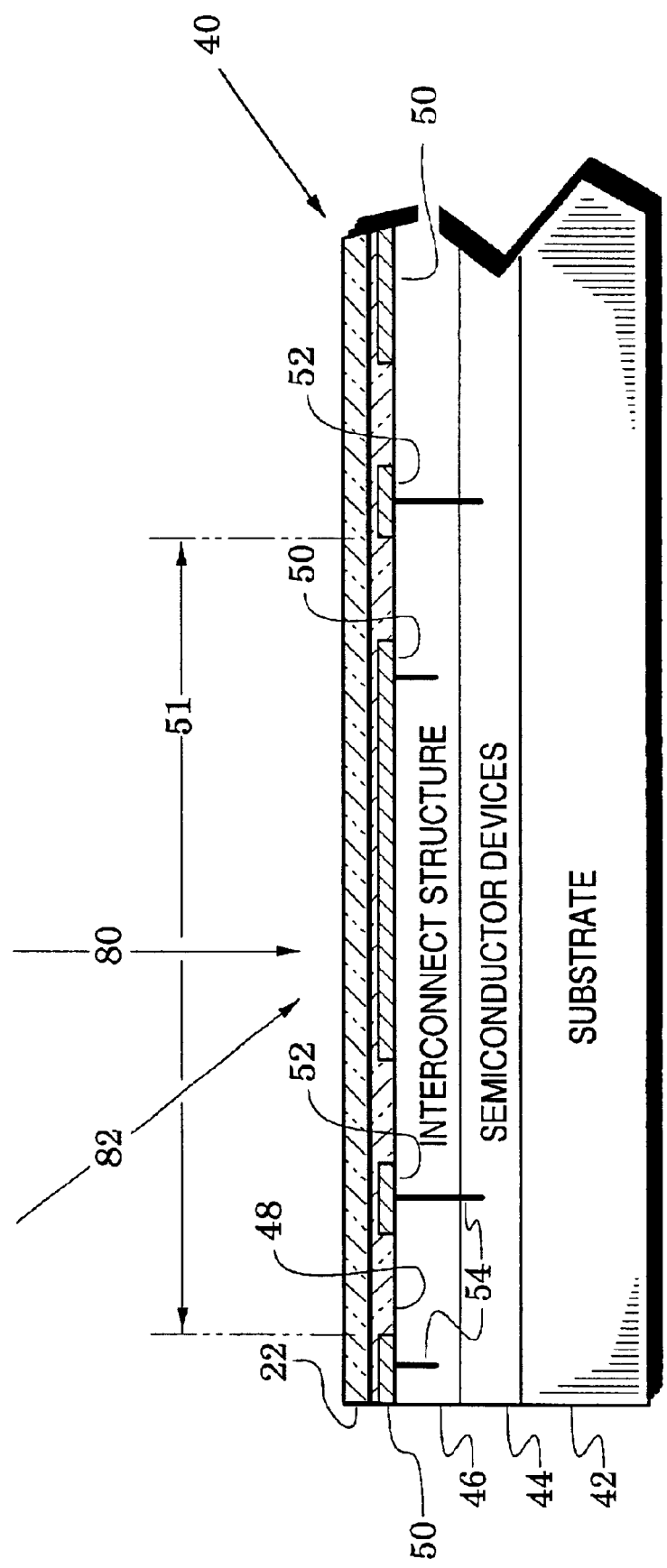
FIG. 3 is an enlarged view along the plane 3—3 in FIG. 2.

FIGS. 2 and 3 illustrate an image sensor embodiment 40 of the present invention whose integrated-circuit structure includes a semiconductor substrate 42, a large number of semiconductor devices 44 carried on the substrate (e.g., diffused into the substrate), and an interconnect structure 46 (alternating layers of refractory-metal lines and insulators) carried over the semiconductor devices.

In addition, the image sensor 40 has a photoconductive medium 48 positioned over the interconnect structure 46, a planar reference electrode 50 in contact with the photoconductive medium and configured to define an array of apertures 51, and an array of planar sense electrodes 52 that are each in contact with the photoconductive medium and positioned within a respective one of the apertures 51 so as to be spaced from the reference electrode 50. As noted in the brief description of drawings, only the upper left and lower right corners of the sensor are shown in detail in FIG. 2 and sense electrodes are eliminated in a portion of the upper left corner to more clearly indicate the reference electrode and the photoconductive medium (breaks in the outer sensor edge indicate that the sensor upper face is substantially greater than shown in FIG. 2).

The photoconductive medium 48 can be any of various materials that demonstrate photoconductivity. That is, any of various materials that generate mobile charge carriers (e.g. electron-hole pairs) in response to photons of incident electromagnetic radiation. As a result their conductivity increases (their resistivity decreases) in proportion to the incident photon flux. Photoconductive mediums of the invention include those which comprise:

a) a first element from group II of the periodic table and a second element from group VI of said periodic table (e.g., cadmium telluride, cadmium sulfide, cadmium selenide and zinc selenide), b) a first element from group V of the periodic table and a second element from group VI of said periodic table (e.g., antimony sulfide), c) a first element from group III of the periodic table and a second element from group V of said periodic table (e.g., gallium arsenide), d) an element from group IV of the periodic table (e.g., silicon), and e) an element from group VI of the periodic table (e.g., selenium).

Although they may be spatially offset in other embodiments, the reference electrode 50 and the sense electrodes 52 are substantially coplanar in the embodiment of FIGS. 2 and 3 and the photoconductive medium 48 is positioned between them. Although the photoconductive medium is shown to extend over the reference and sense electrodes in FIG. 3, its upper surface may be lowered (e.g., polished) back to be coplanar with the upper surface of the reference and sense electrodes in other embodiments.

Because it defines apertures 51, the reference electrode 50 is especially effective in reducing lateral spread of the mobile charge carriers that are generated in the photoconductive medium 48 by incident electromagnetic radiation. The reduced lateral spread of this aperture configuration enhances definition of pixel regions in image signals generated by the image sensor 40.

In the embodiment of FIG. 2, the reference electrode 50 forms elongate reference members 56 that each extend into a respective one of the apertures 51. Each of the sense electrodes 52 forms elongate sense members 58 which are arranged in an interdigitated relationship with a respective one of the elongate reference members 56. Because it increases path length between adjacent members, this arrangement enhances sensitivity of signal converters (described below) that respond to conductivity changes in the photoconductive medium 48.

As shown in FIG. 3, the reference electrode 50 and the sense electrodes 52 are connected by conventional vias (vertical conductive paths) 54 to the semiconductor devices 44 and the interconnect structure 46. The vias have negligible lateral dimensions and can be moved laterally so long as they reach their intended target. They thus impose negligible restraints on the arrangement of the interconnect structure 46 and the semiconductor devices 44.

Figure 4:
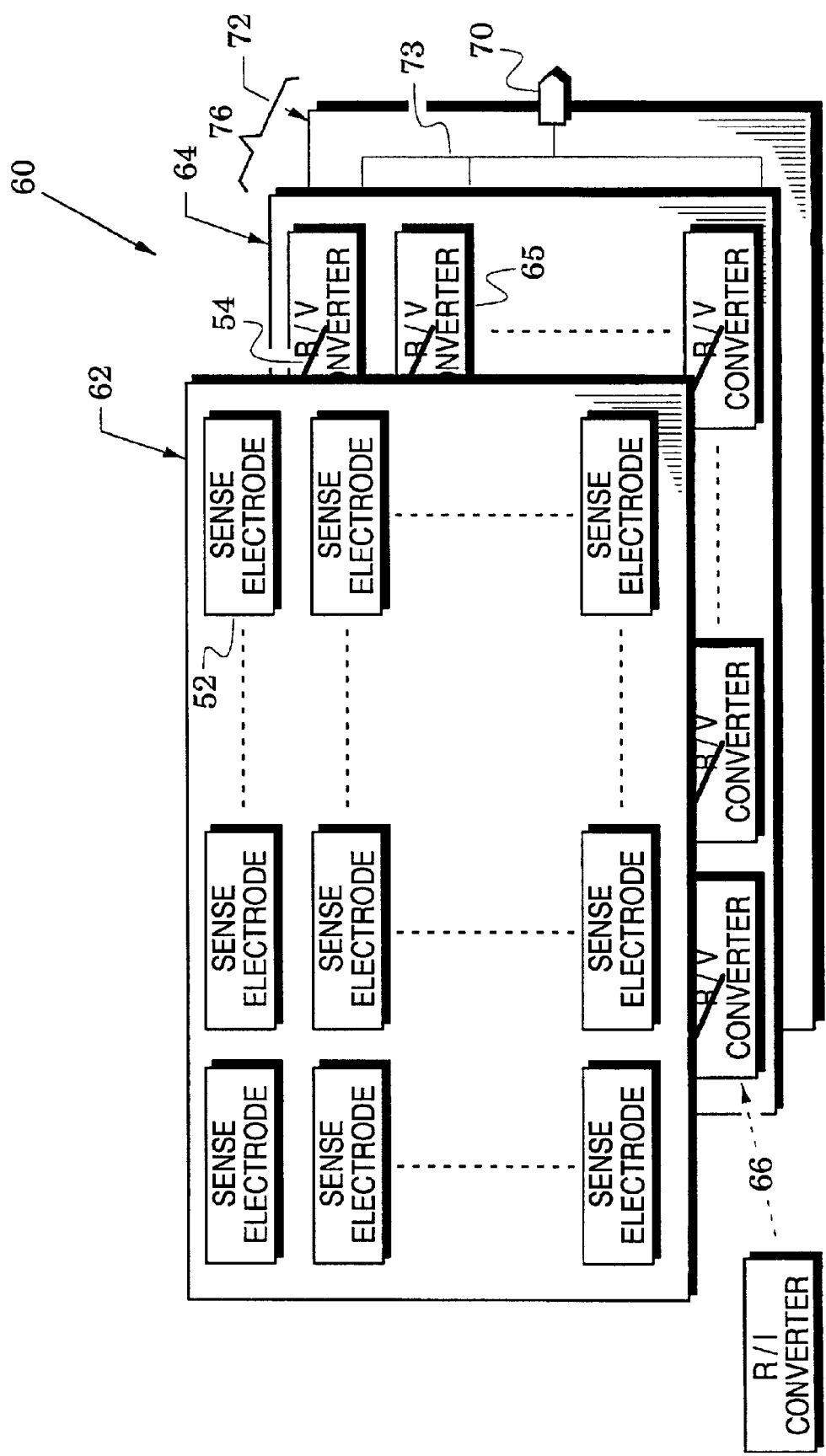
FIG. 4 is a schematized block diagram that illustrates spatial relationships between sense electrodes of FIG. 2 and signal conversion and transmission elements that are formed from the semiconductor devices and interconnect structures of FIG. 3, FIGS. 5A–5D are block diagrams of signal transmission embodiments in the block diagram of FIG. 4, and FIGS. 6A–6F are top views of other sense and reference electrode embodiments.

The vias 54 are also shown in the schematized block diagram 60 of FIG. 4 which shows an array 62 of the sense electrodes 52 of FIG. 3. The interconnect structure (46 in FIG. 3) preferably connects the semiconductor devices (44 in FIG. 3) into a corresponding array 64 of signal converters 65 which, in one image sensor embodiment, are resistance-to-voltage converters and as indicated by exemplary substitution arrow 66, are resistance-to-current converters in another image sensor embodiment.

The block diagram 60 of FIG. 4 further shows that each of the sense electrodes 52 is connected by a respective via 54 to a respective signal converter 65 and sense signals from the array 64 of signal converters 65 are coupled to an image sensor output port 70 by a signal transmission network 72 which defines signal transmission paths 73. Together, the array 64 of signal converters 65 and the signal transmission network 72 form a signal conversion and transmission system 76.

In operation of the image sensor 40 of FIGS. 2–4, impinging electromagnetic radiation generates a conductivity change in the photoconductive medium 48 within each reference electrode aperture 51. Accordingly, the resistance between the reference electrode 50 and the aperture's respective sense electrode 52 is altered. In one image sensor embodiment, the reference electrode is connected by a respective via 54 to a potential structure (e.g., ground) of the signal conversion and transmission system 76 of FIG. 4 and the respective sense electrode is connected by a respective via 54 to a respective one of the signal converters 65 which converts the resistance alteration to a corresponding sense signal. The sense signals of the array 64 of signal converters 65 (or signals that correspond to the sense signals) are then transported to the image sensor output port 70 of FIG. 4 by the signal transmission network 72.

The signal converters 65 of the invention may be structured in conformance with a wide variety of conventional converter circuits. An exemplary embodiment includes a differential pair of transistors in which one of the differential input signals is generated by a resistive divider that includes the alterable resistance associated with a respective sense electrode 52 and, in response, the differential pair steers a current which can be the converted current signal. Alternatively, the steered current can be directed through a resistor to generate a converted voltage signal.

Any of numerous conventional switched-capacitor structures may also be used as the signal converters 65 of the invention. Other switched-capacitor structures (e.g., switched-capacitor integrators and filters) may also form parts of the signal conversion and transmission systems (76 in FIG. 4) of the invention.

In FIGS. 5A–5C, the array of signal converters (64 in FIG. 4) is shown in combination with several embodiments of the signal transmission network (72 in FIG. 4) to thereby form embodiments of the signal conversion and transmission system (76 in FIG. 4). For example, the signal transmission network 72A of FIG. 5A is an analog multiplexer system that may comprise, for example, CCD registers and arrays or CMOS readout structures in which address lines signal a CMOS transistor to pass a sense signal to the output port 70 of a signal conversion and transmission system 76A.

FIG. 5B illustrates another exemplary signal conversion and transmission system 76B in which converted analog signals from the signal transmission network 72A (of FIG. 5A) are converted to corresponding digital signals by an analog-to-digital converter (ADC) 72B before delivery to the output port 70.

Yet another exemplary signal conversion and transmission system 76C is shown in FIG. 5C. In this system, analog sense signals from the signal converter array 64 are converted to corresponding digital sense signals in an ADC system 72C and the digital signals routed to the output port 70 by a digital multiplexer system in the form of a data bus network 72D.

In another exemplary signal conversion and transmission system 76D of FIG. 5D, sense signals from different groups of the signal converter array 64 are locally routed to a distributed ADC system 72F by analog multiplexers 72E. Thus each ADC in the distributed system receives sense signals from a local group of signal converters and converts them to corresponding digital signals. The corresponding digital signals are then routed along a data bus network 72G which connects each of the ADCs to the output port.

Figure 6A:
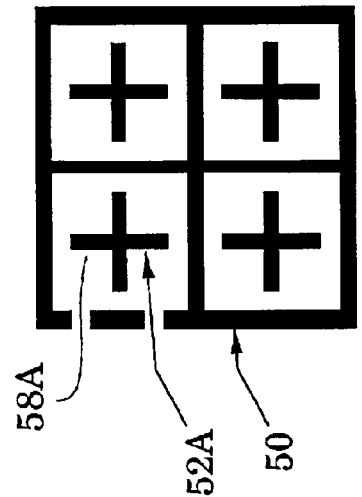
Figure 6B:
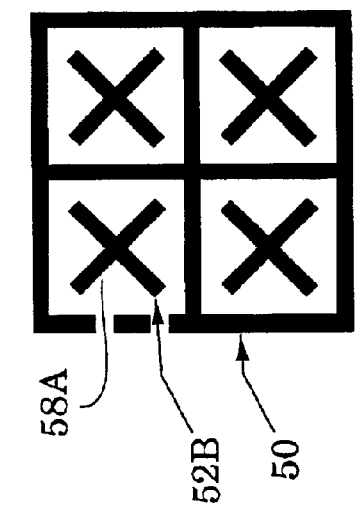
Figure 6C:
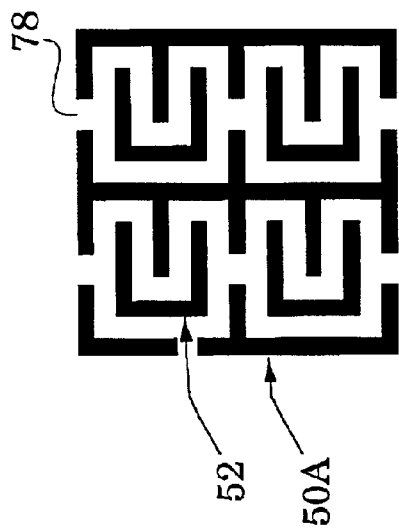
Figure 6D:
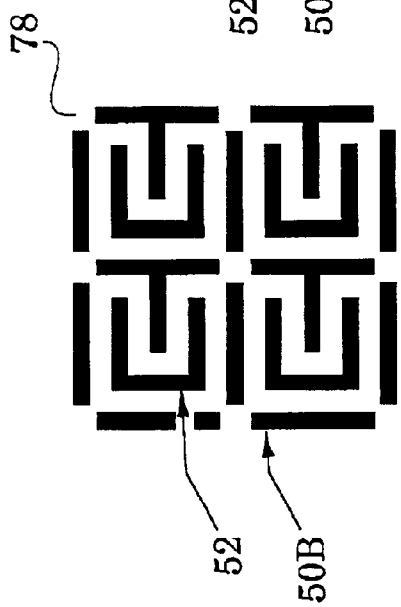

FIG. 6A illustrates different sense electrode embodiments 52A which each comprises orthogonally-arranged elongate sense members 58A. The sense electrode 52A is rotated 45° in FIG. 6B to become a sense electrode embodiment 52B. Although the reference electrode 50 of FIGS. 6A and 6B defines apertures with continuous borders, it may be desirable for various reasons (e.g., ease of fabrication) to introduce gaps in the borders. Accordingly, FIGS. 6C and 6D illustrate reference electrodes 50A and 50B that have gaps 78 but continue to define apertures that inhibit lateral movement of mobile charge carriers (it is noted that portions of the aperture borders are absent in FIGS. 2 and 6A–6D to permit passage of reference lead lines—these absences are for illustrative clarity and are not intended to represent gaps in the borders).

Figure 6E:
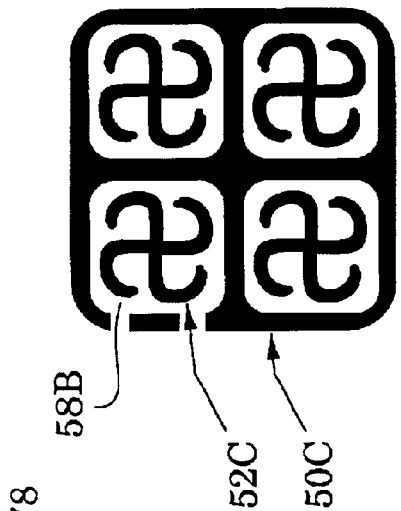
Figure 6F:
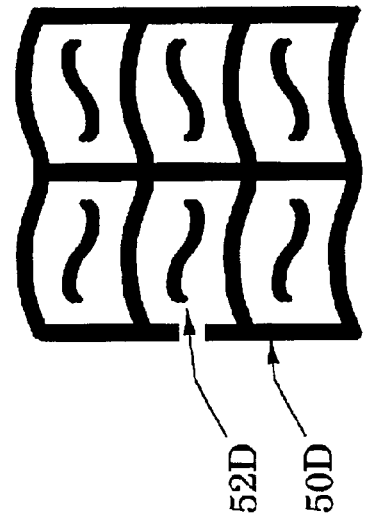

Although the reference electrode 50 and the sense electrode 52 of FIG. 2 are defined with linear elements, other sensors of the invention may be realized with nonlinear elements. For example, FIG. 6E illustrates sense electrode embodiments 52C which each comprise nonlinear sense members 58B and that are positioned within apertures defined by a nonlinear reference electrode 50C. For a second example, FIG. 6F illustrates nonlinear sense electrode embodiments 52D that are positioned within apertures defined by a partially-linear and partially-nonlinear reference electrode 50D.

Image sensors of the present invention resolve conflicts of conventional sensors wherein different functional systems demand access through the same internal spaces of VLSI structures. For example, FIG. 3 illustrates the lateral extent of an exemplary aperture 51 and shows an exemplary incident radiation ray 80 that is orthogonal to the plane of the reference and sense electrodes 50 and 52 and photoconductive medium 48. Because the electrodes and the photoconductive medium are carried over the interconnect structure 46, the radiation ray 82 does not pass through this structure as it must in conventional sensors.

Accordingly, the interconnect structure 46 and the semiconductor devices 44 are not excluded from regions of the incident radiation. Not only may they occupy this region, they may be independently arranged to best meet their functions of signal conversion and transmission without regard to the sense functions of the photoconductive medium and its associated reference and sense electrodes. As shown in FIG. 3, only the sensor's vias 54 need pass through the interconnect structure 46. Because the lateral extent of each via is negligible and because vias may be laterally moved so long as they contact their intended target, their passage imposes negligible restrictions upon the arrangement of the interconnect structure and the semiconductor devices.

In further contrast to conventional sensors, those of the invention will respond to radiation rays that are tilted from orthogonality (as exemplified in FIG. 3 by the radiation ray 82) because the photoconductive medium is carried at the sensor's upper face. This feature of the invention may be advantageous in some sensor applications. In other applications, tilted radiation rays can be excluded by supplemental structures.

Images produced by sensors of the invention have enhanced pixel definition because the invention's reference electrodes are configured with apertures that reduce lateral spread of radiation-induced mobile charge carriers.

Sensors of the invention are configured for fabrication in conventional VLSI structures as realized by their associated photolithographic techniques. For example, thin films of the photoconductive mediums of the invention may be applied with vapor or chemical deposition processes. Sensor substrates may be realized with conventional semiconductors (e.g., silicon) and sensor electrodes realized with various refractory metals. Although the signal conversion and transmission systems of the invention are especially suited for realization with CMOS devices, other conventional devices (e.g., bipolar junction devices) may be used.

In the present invention, photoconductive mediums (48 in FIG. 8) are understood to be any of various materials that demonstrate photoconductivity. That is, any of various materials that generate mobile charge carriers in response to photons of incident electromagnetic radiation. As a result their conductivity increases in proportion to the incident photon flux. When used in accordance with the invention, (e.g., see FIG. 4) such mediums exhibit a photovoltaic effect, i.e., they generate a signal (e.g., a voltage) in response to incident light.

Sensors of the invention are suitable for a wide range of applications such as digital cameras, video camcorders, notebook computer cameras, mobile-telephone cameras, surveillance cameras, vehicle-collision-avoidance systems and traffic-control systems.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An integrated-circuit structure for construction of an image sensor, comprising:

a substrate;

a plurality of semiconductor devices carried on said substrate;

an interconnect structure carried over said semiconductor devices;

a reference electrode that is carried over said interconnect structure and is configured to define an array of apertures;

an array of sense electrodes that are each positioned within a respective one of said apertures;

a photoconductive medium that abuts said reference and sense electrodes; and vias that couple said reference electrode and each of said sense electrodes to said interconnect structure and said semiconductor devices;

said semiconductor devices thereby connectable by said interconnect structure to form a signal conversion and transmission circuit that provides image signals initiated by said photoconductive medium in response to incident electromagnetic radiation.

2. The structure of claim 1, wherein said photoconductive medium and said reference and sense electrodes are substantially coplanar.

3. The structure of claim 1, wherein said photoconductive medium lies substantially in a first plane and said reference and sense electrodes lie substantially in a different second plane.

4. The structure of claim 1, wherein said reference and sense electrodes and said vias comprise a refractory metal.

5. The structure of claim 1, wherein each of said sense electrodes forms an elongate sense member.

6. The structure of claim 1, wherein:

said reference electrode forms a plurality of elongate reference members that each extends within a respective one of said apertures; and each of said sense electrodes forms an elongate sense member that is spaced from a respective one of said elongate reference members.

7. The structure of claim 6, wherein said elongate reference and sense members are arranged in an interdigitated arrangement.

8. The structure of claim 6, wherein said reference electrode defines a continuous border about each of said apertures.

9. The structure of claim 1, wherein said photoconductive medium comprises a first element from group II of the periodic table and a second element from group VI of said periodic table.

10. The structure of claim 9, wherein said photoconductive medium is a selected one of cadmium telluride, cadmium sulfide, cadmium selenide and zinc selenide.

11. The structure of claim 1, wherein said photoconductive medium comprises a first element from group V of the periodic table and a second element from group VI of said periodic table.

12. The structure of claim 11, wherein said photoconductive medium is antimony sulfide.

13. The structure of claim 1, wherein said photoconductive medium comprises a first element from group III of the periodic table and a second element from group V of said periodic table.

14. The structure of claim 1, wherein said photoconductive medium comprises an element from group IV of the periodic table.

15. The structure of claim 1, wherein said photoconductive medium comprises an element from group VI of the periodic table.

16. The structure of claim 1, wherein said interconnect structure comprises alternating layers of a refractory metal and an insulator.

17. The structure of claim 16, wherein said insulator is silicon dioxide.

18. The structure of claim 1, wherein said semiconductor devices include transistors.

19. The structure of claim 1, wherein said substrate is formed from a semiconductor.

20. An image sensor for generation of an image signal in response to incident electromagnetic radiation, comprising:

a substrate;

a plurality of semiconductor devices carried on said substrate;

an interconnect structure carried over said semiconductor devices;

a reference electrode that is carried over said interconnect structure and is configured to define an array of apertures;

an array of sense electrodes that are each positioned within a respective one of said apertures;

a photoconductive medium that abuts said reference and sense electrodes;

a signal conversion and transmission system formed by said semiconductor devices and said interconnect structure; and vias that couple said reference electrode and each of said sense electrodes to said signal conversion and transmission system to thereby generate and provide sense signals in response to conductivity changes in said photoconductive medium that are induced by electromagnetic radiation incident upon said photoconductive medium.

21. The sensor of claim 20, wherein said photoconductive medium and said reference and sense electrodes are substantially coplanar.

22. The sensor of claim 20, wherein said photoconductive medium lies substantially in a first plane and said reference and sense electrodes lie substantially in a different second plane.

23. The sensor of claim 20, wherein each of said sense electrodes forms an elongate sense member.

24. The sensor of claim 20, wherein:

said reference electrode forms a plurality of elongate reference members that each extends within a respective one of said apertures; and each of said sense electrodes forms an elongate sense member that is spaced from a respective one of said elongate reference members.

25. The sensor of claim 24, wherein said elongate reference and sense members are arranged in an interdigitated arrangement.

26. The sensor of claim 25, wherein said reference electrode defines a continuous border about each of said apertures.

27. The sensor of claim 20, wherein said photoconductive medium comprises a first element from group II of the periodic table and a second element from group VI of said periodic table.

28. The sensor of claim 27, wherein said photoconductive medium is a selected one of cadmium telluride, cadmium sulfide, cadmium selenide and zinc selenide.

29. The sensor of claim 20, wherein said photoconductive medium comprises a first element from group V of the periodic table and a second element from group VI of said periodic table.

30. The sensor of claim 29, wherein said photoconductive medium is antimony sulfide.

31. The sensor of claim 20, wherein said photoconductive medium comprises a first element from group III of the periodic table and a second element from group V of said periodic table.

32. The image sensor of claim 20, wherein said photoconductive medium comprises an element from group IV of the periodic table.

33. The sensor of claim 20, wherein said photoconductive medium comprises an element from group VI of the periodic table.

34. The sensor of claim 20, wherein said signal conversion and transmission network includes a plurality of signal converters that are coupled by said vias to said sense electrodes to corresponding analog signals in response to resistance changes in said photoconductive medium.

35. The sensor of claim 34, wherein said converters are resistance-to-voltage converters.

36. The sensor of claim 34, wherein said converters are resistance-to-current converters.

37. The sensor of claim 34, wherein said signal conversion and transmission system further includes:
   a signal output port; and
   an analog multiplex network that provides the corresponding analog signals of said sense electrodes to said output port.

38. The sensor of claim 34, wherein said signal conversion and transmission system further includes an analog-to-digital converter that converts said corresponding analog signals to corresponding digital signals.

39. The sensor of claim 34, wherein said signal conversion and transmission system further includes:
   a signal output port;
   an analog-to-digital network that converts said corresponding analog signals to corresponding digital signals; and
   a digital data bus that provides said corresponding digital signals to said output port.

40. The sensor of claim 34, wherein said signal conversion and transmission system further includes:
   a signal output port;
   analog multiplexers that are each coupled to a respective group of said sense electrodes;
   distributed analog-to-digital converters that receive said corresponding analog signals from said analog multiplexers and convert them to corresponding digital signals; and
   a digital data bus that provides said corresponding digital signals to said output port.

41. The sensor of claim 20, wherein said reference and sense electrodes and said vias comprise a refractory metal.

42. The sensor of claim 20, wherein said interconnect structure comprises alternating layers of a refractory metal and an insulator.

43. The sensor of claim 39, wherein said insulators comprise silicon dioxide.

44. The sensor of claim 20, wherein said semiconductor devices include transistors.

45. The sensor of claim 20, wherein said substrate is formed from a semiconductor.

* * * * *